United States Patent
Wiesa et al.

[19]

[11] Patent Number: 5,880,935
[45] Date of Patent: Mar. 9, 1999

[54] DEVICE FOR USING IN AN ELECTRONIC CONTROLLER

[75] Inventors: Thomas Wiesa, Vaihingen; Ralph Schimitzek, Obersulm/sulzbach; Dieter Karr, Tiefenbronn, all of Germany

[73] Assignee: Robert Bosch GmbH, Stuttgart, Germany

[21] Appl. No.: 800,950

[22] Filed: Feb. 14, 1997

[30] Foreign Application Priority Data

Feb. 17, 1996 [DE] Germany .................. 196 05 966.6

[51] Int. Cl.$^6$ .................................................. H05K 1/14
[52] U.S. Cl. .................. 361/743; 361/792; 29/831; 228/180.21
[58] Field of Search ................... 361/736, 737, 361/743, 792, 794, 795; 228/245, 249, 180.21; 29/830, 831, 843, 834, 836

[56] References Cited

U.S. PATENT DOCUMENTS

| | | | |
|---|---|---|---|
| 4,549,200 | 10/1985 | Ecker et al. | 361/736 |
| 5,048,166 | 9/1991 | Wakamatsu | 29/830 |
| 5,051,869 | 9/1991 | Goldfarb | 361/743 |
| 5,386,341 | 1/1995 | Olson et al. | 361/792 |

FOREIGN PATENT DOCUMENTS

| | | | |
|---|---|---|---|
| 0 613 331 | 8/1994 | European Pat. Off. | H05K 3/34 |
| 38 29 153 | 3/1989 | Germany | H05K 1/14 |
| 42 08 594 | 9/1993 | Germany | H05K 03/36 |
| 42 08 594 A1 | 9/1993 | Germany . | |
| 295 13 489 | 12/1995 | Germany | G06F 1/18 |

OTHER PUBLICATIONS

Patent Abstracts of Japan, vol. 13, No. 578 (E–864), Dec. 20, 1989, JP 01 241888A (matsushita Elec. Inc. Co.).
Printed Circuits Handbook, C. Coombs, Jr, ed., McGraw–Hill Book Co., 3rd ed., Chapter 35, pp. 35.3–35–5: Flexible Circuit Design, Material, and Fabrication by Steve Gurley, 1988.

*Primary Examiner*—Leo P. Picard
*Assistant Examiner*—John B. Vigushin
*Attorney, Agent, or Firm*—Kenyon & Kenyon

[57] ABSTRACT

A device, in particular for use in an electronic controller, includes a card rack and a subassembly. The device is manufactured by soldering over a large area the unpopulated back side of the subassembly to this card rack. The soldering can be performed using a reflow soldering process and can be automated, and thus suitable for mass production. The electrical connections of the subassembly are led spatially and electrically separately from the mechanical attachment of the subassembly to the card rack. The subassembly can be an additional component mounted on the card rack with a new additional function, so that the controller can be flexibly adapted to a given requirement profile in a simple manner by combining, in a flexible manner, a plurality of subassemblies with different layouts and modes of operation on the card rack.

12 Claims, 3 Drawing Sheets

DEVICE FOR USING IN AN ELECTRONIC CONTROLLER

BACKGROUND INFORMATION

German Patent Application No. 42 08 594 describes a first card rack, which can be, for example, a printed circuit board, and a subassembly soldered to this first card rack, which consists of a second card rack and components mounted on the same. This German Application shows a film PC board as a second card rack with SMD (Surface Mounted Device) modules mounted using a reflow soldering procedure, which are interconnected by printed conductors provided on the film PC board. The subassembly is used for repairing defective PC boards or for supplementing the PC board layout with additional electronic components mounted on the subassembly. For this purpose, the film PC board is soldered to the electric contact points referred to as pins. The vibration strength of the film PC board is ensured using an adhesive applied between the film PC board and the PC board. It must be considered disadvantageous in this design that when the film PC board is mounted on the PC board the additional mechanical fastening by the adhesive and soldering to the pins must be performed in separate steps. Heat cannot be properly removed from the subassembly through the adhesive and the pins. It is also disadvantageous that the subassemblies soldered to the contact pins of the components can only be mounted on the unpopulated back of the PC board and soldering must be done manually.

SUMMARY OF THE INVENTION

The device according to the present invention is advantageous since the subassembly is mechanically fastened in a simple manner by large-surface soldering of the unpopulated back of the second card rack (which forms the baseplate of the subassembly) to the first module support. Such soldering can be performed using a reflow soldering process and can be automated, being well-suited for mass production. Furthermore, such a solder layer considerably improves the heat transfer from the subassembly to the first module support, so that simultaneous cooling of the subassembly is achieved. In addition, it is advantageous that the electrical connection of the subassembly is electrically and spatially separated from the mechanical attachment of the subassembly to the card rack, since the electrical connections of the subassembly are not subject to mechanical stresses. It is particularly advantageous that the components and electrical connections on the first and second card racks can be sized differently. Thus, for example, it is possible to provide a subassembly with very fine structures, such as very narrow printed conductors and very small through contacts, on a card rack with much larger structures. As the components are mounted and wired on the subassembly in a separate process, it is not necessary to proceed with the same precision and caution when manufacturing the larger structures on the first card rack as it is when manufacturing the considerably more compact structures on the subassembly. This substantially reduces manufacturing costs. In addition, the use of subassemblies with fine structures saves space.

The subassembly can also be mounted on different card racks in a flexible manner to provide a certain additional function regardless of whether other special components are present on the first card rack. The subassembly can then be regarded simply as an supplementary component with a new additional function, mounted on the first card rack. Therefore, an electronic controller can be adapted to a given profile of requirements in a simple manner by combining several subassemblies of different layouts and modes of operation on the card rack of the controller.

By using multilayer substrates, the second card rack can be advantageously configured by the possibility of wiring the components on the second card rack in several positions.

Furthermore, the design of the electrical connecting surfaces of the subassembly is advantageous in that it allows the electrical connections between the subassembly and the conductor terminals on the first card rack to be manufactured in a simple manner.

Another embodiment according to the present invention allows improved heat input when punch soldering is used. Heat can also reach the soldered layers underneath the terminal pad more easily through the metal-plated recesses of the terminal pad. By connecting the top and bottom metallic layers of the terminal pads, heat is removed from the top of the terminal pad through its outer edge to the bottom under the solder when punch soldering is used.

Suitable manufacturing processes for the device are described herein. If the distances of the electrical terminals on the terminal pads are sufficiently large so that the terminals can be soldered by the reflow soldering process, the advantage of being able to solder the second card rack to the first card rack and the electrical terminals of the subassembly in a common reflow soldering process is obtained. If the terminals of the subassembly are closer to one another, they are soldered to the terminals of the first card rack using a punch soldering process after the subassembly has been soldered to the first card rack.

DETAILED DESCRIPTION

Figure 1:
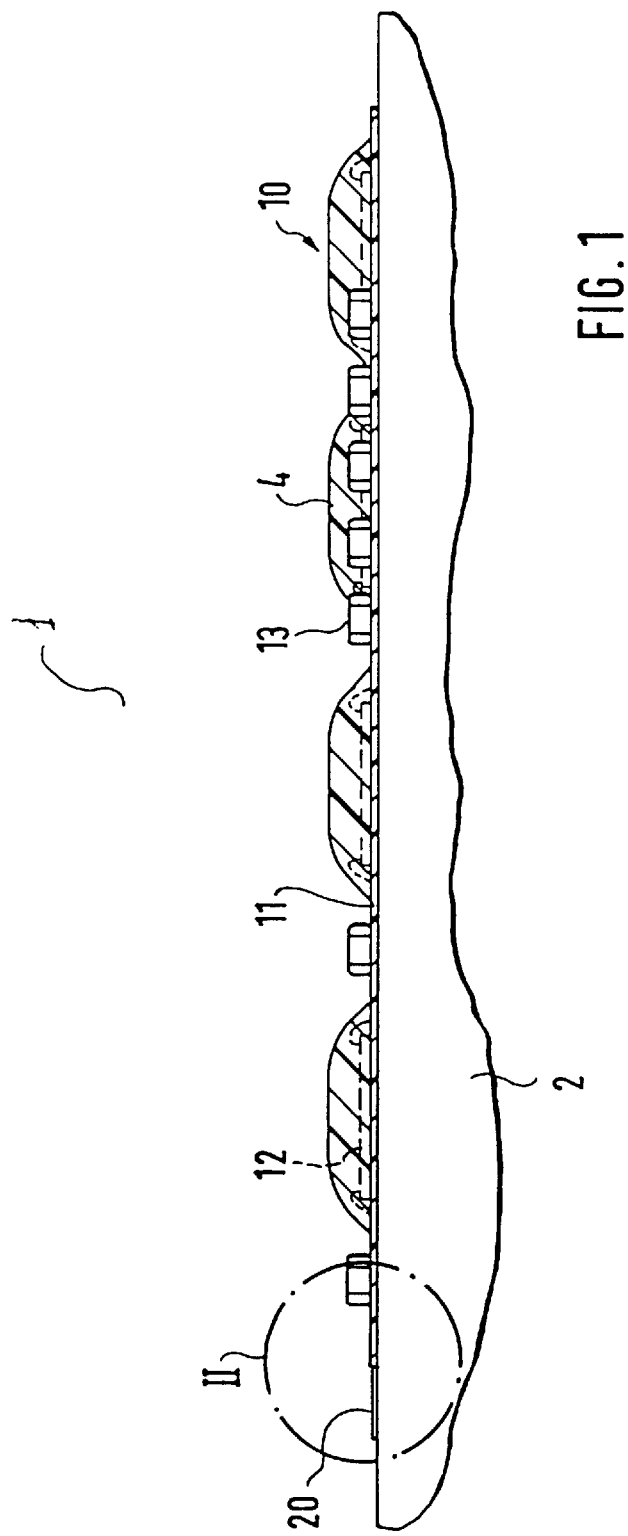
FIG. 1 shows a partial view of a section through a card rack of an electronic controller with a subassembly soldered to the controller.

FIG. 1 shows a section from a first card rack 2 of an electronic controller 1. A subassembly 10, including second card rack 11 and electronic components 12 and 13 mounted on the same, is mounted on first card rack 2. Components 12 and 13 represent, for example, the electronic control circuit or similar logic circuits. In this embodiment according to the present invention, unenclosed components 12 are mounted on the second card rack 11 using a chip-on-board method and connected to the conductors (not illustrated) via bond wires. Components 12 are protected with an epoxy substrate capsule 4, called "globe top." In addition to components 12, additional components 13, such as SMD components, may be present on card rack 11. Components 12 and 13 are interconnected using connectors not illustrated in FIG. 1 and form (independently of any other components that may be present on the first card rack 2) an electronic circuit with at least one function to be assigned to subassembly 10, which is available through the installation of this subassembly 10 in controller 1. Terminal pad 20 of subassembly 10 is illustrated on the left side of FIG. 1.

Figure 2:
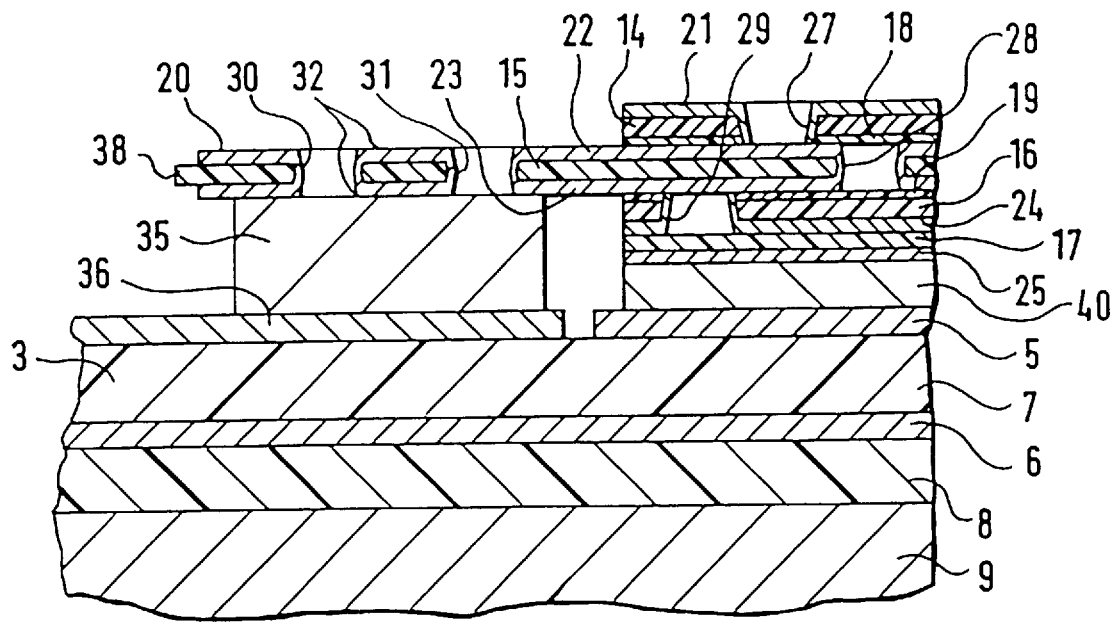
FIG. 2 shows a first embodiment of an enlarged section illustrated in FIG. 1.

Terminal pad 20 shown in FIG. 1 (shown as encircled) is enlarged to show a first embodiment according to the present invention which is illustrated in FIG. 2 and shown without components 12 and 13. In this embodiment, card rack 2 includes a flexible PC board film 3 made of a polyimide layer 7 plated on both sides with copper layers 5 and 6 and permanently attached to a metallic support 9 made, for example, of aluminum, via an electrically non-conducting prepreg layer 8. It is, however, possible to use other flexible or rigid thin laminates on a metallic support 9. Card rack 11 of subassembly 10, of which only an edge area is shown here with terminal pad 20, includes a multilayer substrate with four copper layers 21, 22, 23, and 24. There are additional polyimide layers 14, 15, 16, separating the individual copper layers, between the copper layers 21, 22, 23 and 24. The additional adhesive layers 18 and 19 serve to make the copper layers 21, 22, 23 and 24 adhere to the polyimide layers. A prepreg layer 17 made of an electrically insulating and heat-conducting material is applied underneath copper layer 24; a large-surface, single-piece copper plate 25, forming the bottom of card rack 11, is in turn applied to prepreg layer 17. Card rack 11 is finally connected to copper layer 5 on the top side of card rack 2 via a large-surface lead/tin solder layer 40 applied underneath copper layer 25.

This solder connection can be produced, for example, by first applying the solder layer over a large area of card rack 2 using a pressing process and then mounting card rack 11 onto solder layer 40. Subsequently card rack 11 is soldered to card rack 2 in a furnace using the reflow soldering process.

Components 12 and 13 on the subassembly are wired using printed conductors on the four copper layers 21, 22, 23, and 24 of card rack 11; the conductors on the different copper layers are interconnected via through contacts. In the first embodiment shown in FIG. 2, for example, a through contact 27 connects a printed conductor on copper layer 21 to a printed conductor on copper layer 22. This in turn is connected to a printed conductor on copper layer 23 via a through contact 28 and to a printed conductor on fourth copper layer 24 via a third through contact 29. The printed conductors and through contacts of subassembly 10 are dimensioned differently from the structures of card rack 2. Thus, the printed conductors on card rack 11 of the subassembly 10 are 75 micrometers wide, the diameter of those through contacts is also 75 micrometers. On the other hand, the printed conductors on card rack 2 are, for example, 300 micrometers wide, and the diameter of the through contacts is 500 micrometers.

Terminal pad 20 of subassembly 10 shown in FIG. 2, is formed by the two copper layers 22 and 23 led through laterally from card rack 11 with polyimide layer 15 between them. The part of copper layers 22 and 23 forming terminal pad 20 has the individual electrical terminals 32 of subassembly 10. Terminals 32 are formed by the conductor connections on copper layers 22 and 23, which are connected via through contacts 30 and 31.

Underneath through contacts 30 and 31 there are lead/tin soldered contacts 35. Each soldered contact 35 is applied to an electrical terminal 36 of a printed conductor on copper layer 5 of card rack 2, so that the subassembly is electrically connected to other circuit components on first card rack 2 via soldered contacts 35. Terminals 32 can be soldered to terminals 36 using a punch soldering process, in which solder is first applied to terminals 36 and then card rack 11 is placed on the solder with terminals 32. Subsequently, a heat punch is pressed onto terminals 32 from above. The heat goes via heat-conducting through contacts 30 and 31 to the bottom of terminal pads 20 and melts the solder. The punch solder process is suited for connecting electric terminals when terminals 32 are close to one another on terminal pad 20. If the terminal density is small and the terminals are not close to one another, the terminals can also be soldered using a reflow soldering process. In that case, soldered contacts 35 and solder layers 40 can also be soldered in a single reflow soldering procedure.

Figure 3:
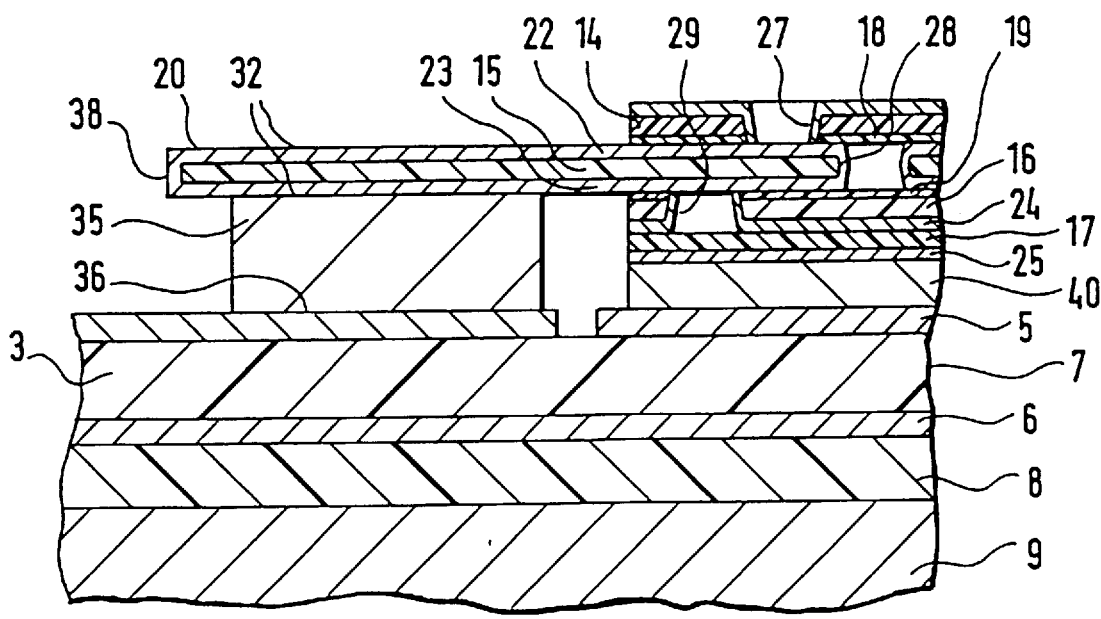
FIG. 3 shows a second embodiment of the enlarged section illustrated in FIG. 1.

FIG. 3 shows a second embodiment of the present invention. Terminal pad 20 shown in FIG. 3 has no through contacts 30, 31 in the area of soldered contacts 35. Copper layers 22 and 23 are in this case connected at the outer edge 38 of terminal pad 20 to remove heat to the bottom of terminals 32 located above the solder.

Figure 4:
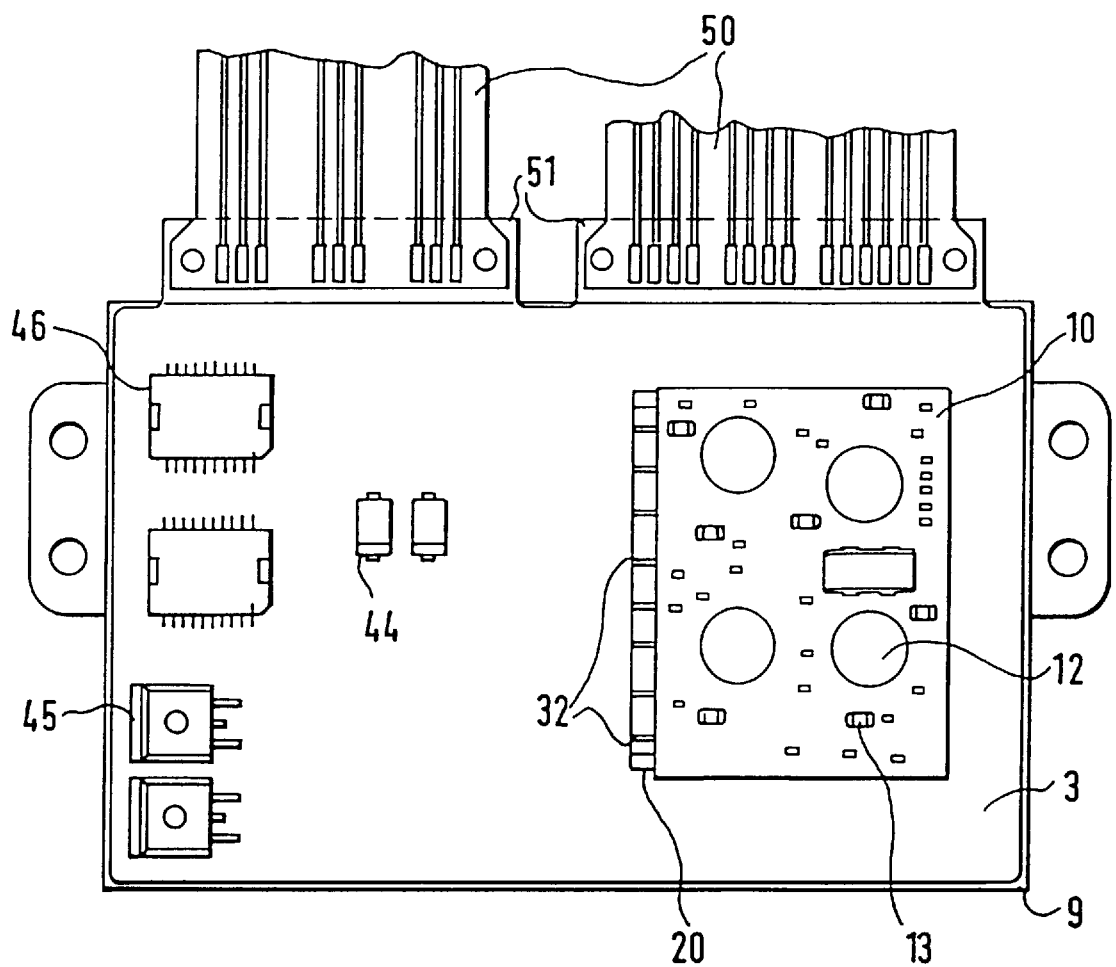
FIG. 4 shows an embodiment of a card rack used in an electronic controller with a subassembly soldered to the controller, with other discrete electronic components.

FIG. 4 shows card rack 2 with a subassembly 10 and other discrete electronic components 44, 45, and 46 soldered to it. PC board film 3 is glued onto metallic support 9. Metallic support 9 forms, together with PC board film 3, card rack 2. Flexible printed conductors, allowing plug connectors 50 to be led through from controller 1, are applied to the upper part of card rack 2. Printed conductors 50 are connected to terminal pad 51 of card rack 2 via a punch solder process. A subassembly 10 includes components 12 and 13 is on card rack 2. The subassembly is connected to terminals 36 (not illustrated) on card rack 2 via terminals 32 on terminal pad 20. In addition to subassembly 10, other electronic components 44, 45, and 46 are located on card rack 2, which can also be SMD components. Components 44, 45, and 46 can be soldered onto card rack 2 either independently of subassembly 10 or together with the same in a single reflow soldering process.

What is claimed is:

1. A device comprising:

a first card rack having a front side;

at least one subassembly connected to the first card rack using a soldered connection and including a second card rack having an unpopulated first side, first and second components being mounted on the second card rack, the first component being connected to the second component via at least one electrical conductor; and a soldered layer applied over a large area between the unpopulated first side of the second card rack and the front side of the first card rack, the soldered layer connecting the second card rack to the first card rack, wherein the soldered layer is electrically insulated from the first and second components.

2. The device according to claim 1, wherein the first component, the second component and the electrical conductors form at least one electronic circuit for obtaining at least one function of the at least one subassembly, the at least one function being obtained independently from at least one of additional components and additional subassemblies mounted on the first card rack.

3. The device according to claim 1, wherein the second card rack includes a multilayer substrate having a plurality of layers, the plurality of layers being traversed with a first plurality of conductors.

4. The device according to claim 3, wherein the second card rack includes a flexible polyimide PC board film and a plurality of copper layers.

5. The device according to claim 1, wherein the at least one subassembly includes at least one terminal pad positioned adjacently parallel to a second side of the second card rack, the at least one subassembly including first individual electrical terminals provided on the at least one terminal pad, and wherein the first card rack provides second terminals for electrically connecting to the first individual electrical terminals at a bottom side of the at least one terminal pad, the first individual electrical terminals being electrically connected with the second terminals via electrical soldered contacts for an external wiring.

6. The device according to claims 1, further comprising:
   discrete electronic components provided on the first card rack.

7. The device according to claims 6, wherein the discrete electronic components include SMD components.

8. The device according to claim 1, wherein the device is part of an electronic controller.

9. The device according to claim 1, wherein the first card rack is connected to the second card rack via an electrically insulated connection and via an electrically conducting connection.

10. A device comprising:
   a first card rack having a front side;
   at least one subassembly connected to the first card rack using a soldered connection and including a second card rack having an unpopulated first side, first and second components being mounted on the second card rack, the first component being connected to the second component via at least one electrical conductor; and
   a soldered layer applied over a large area between the unpopulated first side of the second card rack and the front side of the first card rack, the soldered layer connecting the second card rack to the first card rack,
   wherein the at least one subassembly includes at least one terminal pad positioned adjacently parallel to a second side of the second card rack, the at least one subassembly including first individual electrical terminals provided on the at least one terminal pad, and wherein the first card rack provides second terminals for electrically connecting to the first individual electrical terminals at a bottom side of the at least one terminal pad, the first individual electrical terminals being electrically connected with the second terminals via electrical soldered contacts for an external wiring, and
   wherein the at least one terminal pad is formed on the second side of the second card rack by extending in-parallel and laterally leading-through two internal layers and an insulating layer, the insulating layer provided between the two internal layers.

11. The device according to claim 10, wherein the at least one terminal pad includes recesses, each of the recesses having metal-plated internal walls positioned above the electrical soldered contacts.

12. The device according to claim 10, wherein the at least one terminal pad includes an upper layer and a lower layer, the upper layer being connected to the lower layer via an outer edge, the outer edge positioned opposite to the second card rack.

* * * * *